US012593531B2

(12) United States Patent
Oku et al.

(10) Patent No.: US 12,593,531 B2
(45) Date of Patent: Mar. 31, 2026

(54) COMPOUND SOLAR BATTERY

(71) Applicant: ADACHI ELECTRIC INDUSTRY CO., Tokyo (JP)

(72) Inventors: Shinji Oku, Kasuga (JP); Yoshitomo Nakata, Tokyo (JP)

(73) Assignee: ADACHI ELECTRIC COMPANY INC., Las Vegas, NV (US)

( * ) Notice: Subject to any disclaimer, the term of this patent is extended or adjusted under 35 U.S.C. 154(b) by 0 days.

(21) Appl. No.: 19/129,967

(22) PCT Filed: Nov. 6, 2023

(86) PCT No.: PCT/JP2023/039830
§ 371 (c)(1),
(2) Date: May 14, 2025

(87) PCT Pub. No.: WO2024/106240
PCT Pub. Date: May 23, 2024

(65) Prior Publication Data
US 2026/0013265 A1 Jan. 8, 2026

(30) Foreign Application Priority Data

Nov. 14, 2022 (JP) ................................. 2022-181493

(51) Int. Cl.
*H10F 77/42* (2025.01)
*H10F 10/161* (2025.01)
*H10F 10/163* (2025.01)

(52) U.S. Cl.
CPC ......... *H10F 77/488* (2025.01); *H10F 10/161* (2025.01); *H10F 10/163* (2025.01)

(58) Field of Classification Search
None
See application file for complete search history.

(56) References Cited

U.S. PATENT DOCUMENTS

2005/0040413 A1* 2/2005 Takahashi .............. B82Y 20/00
257/96
2010/0116333 A1* 5/2010 Ponce ................. H10F 77/1437
257/E21.04

(Continued)

FOREIGN PATENT DOCUMENTS

CN 109560166 A 4/2019
CN 111430493 A 7/2020

(Continued)

*Primary Examiner* — Eli S Mekhlin
(74) *Attorney, Agent, or Firm* — Kratz, Quintos & Hanson, LLP

(57) ABSTRACT

A compound solar battery according to the present invention is provided with a laminated film 2 including: a reflection layer 20 formed of an AlGaAs layer; a front surface-side light absorption layer 10 formed between a surface electrode 1 and the reflection layer 20; and a back surface-side light absorption layer 30 formed between the reflection layer 20 and a substrate 3. The reflection layer 20 is formed of a front surface-side reflection layer 20u and a back surface-side reflection layer 20d. A Al content ratio in the front surface-side reflection layer 20u is set to be greater than that in the back surface-side reflection layer 20d. In the back surface-side light absorption layer 30, a first InGaP layer 31, a first GaAs layer 32, a second InGaP layer 33, a second GaAs layer 34, and a third InGaP layer 35 is formed by laminating from the substrate 3 side, and a film thickness of the second GaAs layer 34 is set to be larger than that of the first GaAs layer 32.

3 Claims, 2 Drawing Sheets

(56)            References Cited

U.S. PATENT DOCUMENTS

| | | |
|---|---|---|
| 2019/0221705 A1 | 7/2019 | Schulte |
| 2021/0328082 A1 | 10/2021 | Ding |

FOREIGN PATENT DOCUMENTS

| | | |
|---|---|---|
| JP | H09-64386 A | 3/1997 |
| JP | 2017-130554 A | 7/2017 |
| JP | 2021-044423 A | 3/2021 |

* cited by examiner

[Fig. 1]
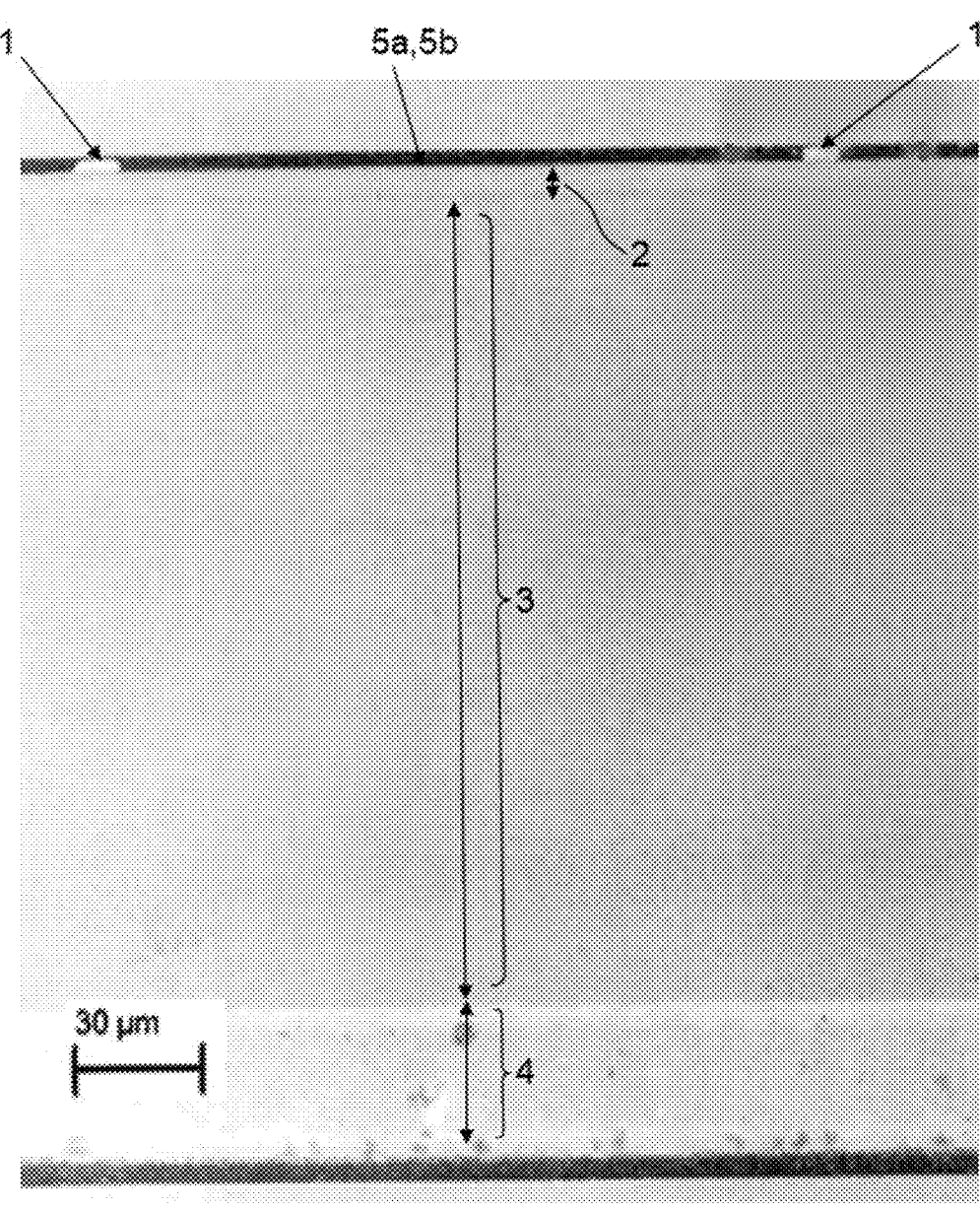

[Fig. 2]
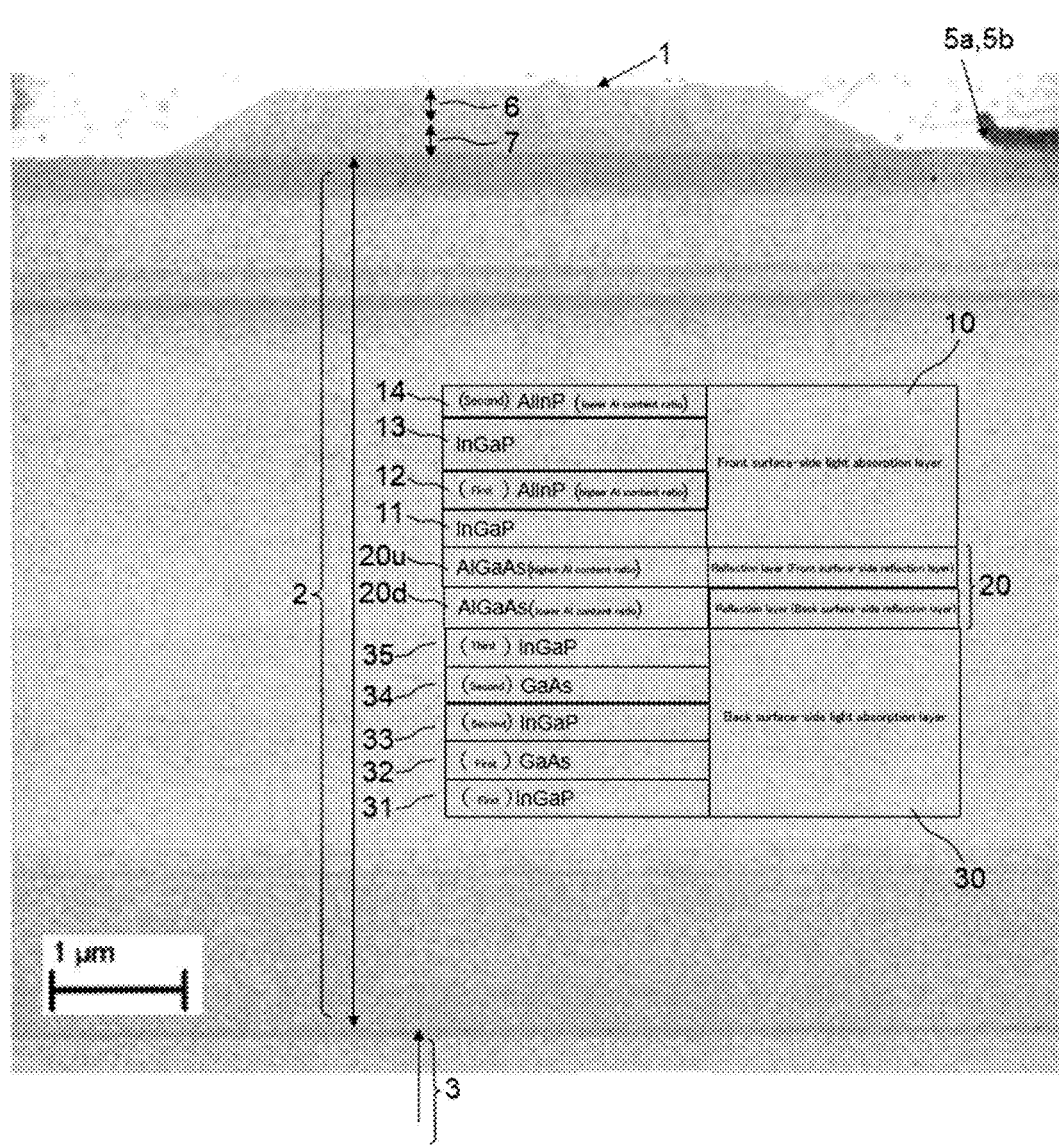

COMPOUND SOLAR BATTERY

TECHNICAL FIELD

The present invention relates to a compound solar battery.

BACKGROUND TECHNIQUE

The energy conversion efficiency of solar batteries, in the case of currently mainstream crystalline silicon solar batteries, has a theoretical maximum value of approximately 29%, whereas commercially available products exhibit efficiencies of approximately 15%.

Meanwhile, research and development are accelerating for next-generation solar batteries that surpass the efficiency of single-junction solar batteries by employing novel concepts and materials beyond conventional approaches, and that offers to prospect for cost reduction. Among solar batteries, compound solar batteries have an efficiency of 37.9% (a value verified by the National Institute of Advanced Industrial Science and Technology in February 2013 for a cell area of approximately 1 cm$^2$). Subsequently, various solar battery cell structures capable of elevating the conversion efficiency limit have been vigorously proposed and demonstrated worldwide. The current world's highest efficiency in experimental results is 46% with a 4-junction solar battery cell. Meanwhile, a research group led by Professor Takashi Kita and Specially Appointed Assistant Professor Shigeo Asahi of the Department of Electrical and Electronic Engineering, Graduate School of Engineering, Kobe University, has proposed high-efficiency power generation by multiple excitons as a solar battery cell structure (quantum dot) that has not existed until now. Also, development is progressing to absorb the long-wavelength components of solar light spectrum which have been lost by transmission in conventional cells, theoretically raising conversion efficiency to over 50%. In this development situation, actual products suitable for general use are compound solar batteries with three junctions at about 36% for use in space, and applications to the automotive industry are expected in the future.

Patent Document 1 proposes a compound solar battery.

PRIOR ART DOCUMENTS

Patent Document

[Patent Document 1] Japanese Patent No. 4804571

SUMMARY OF THE INVENTION

Problem to be Solved by the Invention

In a compound solar battery, it is desirable to utilize light in a wide range of wavelengths and further increase power generation efficiency.

Therefore, the purpose of this invention is to provide a compound solar battery that can effectively utilize light in a wide range of wavelengths.

Means for Solving the Problem

A compound solar battery according to claim 1 of the present invention in which a surface electrode 1, a laminated film 2, a substrate 3, and a back electrode 4 are stacked in order, and which generates electricity by allowing light to enter from a side of the partially formed the surface electrode 1. As the laminated film 2, a reflection layer 20 formed of an AlGaAs layer, a front surface-side light absorption layer 10 formed between the surface electrode 1 and the reflection layer 20, and a back surface-side light absorption layer 30 formed between the reflection layer 20 and the substrate 3 are provided. The reflection layer 20 is formed of a front surface-side reflection layer 20u and a back surface-side reflection layer 20d. An Al content ratio in the front surface-side reflection layer 20u is set to be greater than that in the back surface-side reflection layer 20d. In the back surface-side light absorption layer 30, a first InGaP layer 31, a first GaAs layer 32, a second InGaP layer 33, a second GaAs layer 34, and a third InGaP layer 35 are formed by laminating from a side of the substrate 3, and a film thickness of the second GaAs layer 34 is set to be larger than that of the first GaAs layer 32.

According to claim 2 of the present invention, in the compound solar battery according to claim 1, the front surface-side light absorption layer 10 has an InGaP layer 13 sandwiched between a first AlInP layer 12 and a second AlInP layer 14, and an Al content ratio in the first AlInP layer 12 stacked on a side of the reflection layer 20 is set to be greater than that of the second AlInP layer 14 stacked on the surface electrode 1 side.

According to claim 3 of the present invention, in the compound solar battery according to claim 2, an InGaP layer 11 is sandwiched between the front surface-side reflection layer 20u and the first AlInP layer 12.

Effect of the Invention

According to the present invention, light in a wide range of wavelengths can be effectively utilized.

BRIEF DESCRIPTION OF THE DRAWINGS

FIG. 1 is an enlarged cross-sectional photograph of essential parts of a compound solar battery according to an embodiment of the present invention; and FIG. 2 is a further enlarged cross-sectional photograph of a part of FIG. 1.

MODE FOR CARRYING OUT THE INVENTION

The compound solar battery according to the first embodiment of the present invention is provided with, as a laminated film, a reflection layer formed of an AlGaAs layer, a front surface-side light absorption layer formed between the surface electrode and the reflection layer, and a back surface-side light absorption layer formed between the reflection layer and the substrate. The reflection layer is formed of a front surface-side reflection layer and a back surface-side reflection layer, and an Al content ratio in the front surface-side reflection layer is set to be greater than that in the back surface-side reflection layer. In the back surface-side light absorption layer, a first InGaP layer, a first GaAs layer, a second InGaP layer, a second GaAs layer, and a third InGaP layer are formed by laminating from a side of the substrate, and a film thickness of the second GaAs layer is set to be larger than that of the first GaAs layer. According to this embodiment, the laminated film is stacked with a front surface-side light absorption layer, a reflection layer, and a back surface-side light absorption layer, and the reflection layer is formed with a front surface-side reflection layer and a back surface-side reflection layer, and since the Al content ratio in the front surface-side reflection layer is set to be greater than that in the back surface-side reflection layer, it is possible to easily reflect light, and to confine light in the GaAs layer, and by making the film thickness of the second GaAs layer, forming the back surface-side light absorption layer, set to be larger than that of the first GaAs layer, the energy confined in the quantum wells at layers each in contact with InGaP can be made almost equal.

The second embodiment of the present invention is a compound solar battery according to the first embodiment, wherein the front surface-side light absorption layer has an InGaP layer sandwiched between a first AlInP layer and a second AlInP layer, and an Al content ratio in the first AlInP layer stacked on a side of the reflection layer is set to be greater than that in the second AlInP layer stacked on the surface electrode side. According to this embodiment, the light energy can be more easily stored in the InGaP layer.

The third embodiment of the present invention is a compound solar battery according to the second embodiment, wherein the InGaP layer is sandwiched between the front surface-side reflection layer and the first AlInP layer. According to this embodiment, the light energy can be further stored.

EXAMPLES

The following describes a compound solar battery according to an embodiment of the present invention. FIG. 1 is an enlarged cross-sectional photograph of essential parts of the compound solar battery according to this embodiment.

The compound solar battery according to this embodiment is provided with a surface electrode 1, a laminated film 2, a substrate 3, and a back electrode 4 stacked in order, and generates electricity by allowing light to enter from the partially formed the surface electrode 1 side.

In this embodiment, the compound solar battery comprises the laminated film 2 formed on a surface of a substrate 3 formed of Ge, and the surface electrode 1 is partially formed on the laminated film 2. A protective film 5a formed of TiOx is formed on the surface of the laminated film 2 where the surface electrode 1 is not formed, and further, a protective film 5b formed of AlOx is formed.

The back electrode 4 is formed on a back surface of the substrate 3.

FIG. 2 is a further enlarged cross-sectional photograph of a part of FIG. 1.

In this embodiment, the surface electrode 1 is formed by stacking an Ag layer and an Au/Pt layer. The Ag layer forms an outer surface, and a TiOx layer 6 and a GaAs layer 7 are stacked in order on the underside of the Au/Pt layer.

The laminated film 2 is formed under the GaAs layer 7.

The laminated film 2 is stacked with a front surface-side light absorption layer 10, a reflection layer 20, and a back surface-side light absorption layer 30.

The reflection layer 20 is composed of an AlGaAs layer.

The reflection layer 20 is formed with a front surface-side reflection layer 20u and a back surface-side reflection layer 20d.

The front surface-side reflection layer 20u consists of a composition ratio of Al of 0.5 to 0.8 to Ga of 0.2 to 0.5, and a thickness of 50 to 100 nm. The back surface-side reflection layer 20d is composed with a composition ratio of Al at 0.1 to 0.4 to Ga at 0.6 to 0.9, and a thickness of 10 to 65 nm, preferably 40 to 65 nm.

Thus, the Al content ratio of the front surface-side reflection layer 20u is greater than that of the back surface-side reflection layer 20d. Also, a thickness of the front surface-side reflection layer 20u is thicker than that of the back surface-side reflection layer 20d. Preferably, the Al content ratio of the front surface-side reflection layer 20u is about 4 times that of the back surface-side reflection layer 20d, and the thickness of the front surface-side reflection layer 20u is about 2 times that of the back surface-side reflection layer 20d.

The front surface-side reflection layer 20u and the back surface-side reflection layer 20d are both AlGaAs layers constituting an electromagnetic wave reflection layer, and both have the function of reflecting electromagnetic waves. The front surface-side reflection layer 20u and the back surface-side reflection layer 20d each have the role of a reflection layer, but to reflect more electromagnetic waves, two layers with different refractive indices are combined.

The reflection layer 20 forms a Bragg mirror by making the Al content ratio of the front surface-side reflection layer 20u greater than that of the back surface-side reflection layer 20d to reflect light (electromagnetic waves). By reflecting the light with the reflection layer 20 in this way, the light is confined in GaAs layers 32, 34, making it easier to absorb wavelengths of 700 nm or more. An amount of power in a double-decker type layer is greater than in a double hetero structure. This allows for an absorption of near-infrared light up to around 900 nm. In tests, power generation up to 930 nm was confirmed.

In the back surface-side light absorption layer 30, which is formed by stacking the GaAs layers 32, 34 and InGaP layers 31, 33, 35, an amount of energy absorbed increases due to the reflection layer 20 made of the AlGaAs layer.

The back surface-side light absorption layer 30 is formed between the reflection layer 20 and the substrate 3.

The back surface-side light absorption layer 30 is formed by stacking, from the substrate 3 side, a first InGaP layer 31, a first GaAs layer 32, a second InGaP layer 33, a second GaAs layer 34, and a third InGaP layer 35, and the film thickness of the second GaAs layer 34 is thicker than that of the first GaAs layer 32. A film thickness of the first InGaP layer 31 is thinner than those of the second InGaP layer 33 and the third InGaP layer 35. A film thickness of the second InGaP layer 33 is thicker than that of the first InGaP layer 31 and the third InGaP layer 35.

The second GaAs layer 34 forms an emitter layer and a base layer by doping with secondary ions. The first GaAs layer 32, like the second GaAs layer 34, forms an emitter layer, a tunnel layer, and a base layer by doping with secondary ions.

This second GaAs layer 34 and first GaAs layer 32 are sandwiched by the third InGaP layer 35, the second InGaP layer 33, and the first InGaP layer 31. Therefore, it becomes a heterojunction with layers having pn layers stacked together.

In this way, an InGaP layer with self-formed quantum dots is formed on a top of the GaAs layer with pn junction. Since different compounds are stacked together, it can be called a heterojunction, and due to the quantum tunneling effect, current flows without waste.

The back surface-side light absorption layer 30 consists of the first GaAs layer 32 with a band gap of 1.43 sandwiched between the first InGaP layer 31 and the second InGaP layer 33 with higher band gaps (1.88), and the second GaAs layer 34 with the band gap of 1.43 sandwiched between the second InGaP layer 33 and the third InGaP layer 35 with the higher band gaps (1.88), thereby providing a double-decker type heterojunction. This creates an energy barrier "hetero barrier" and the energy can be confined in the first GaAs layer 32 and the second GaAs layer 34 with smaller energy band gaps, allowing for efficient absorption of an incident light energy.

By making the film thickness of the second GaAs layer 34, which is on the incident light side, thicker than that of the first GaAs layer 32, which is on the substrate 3 side, energy confined in quantum wells at the InGaP layers 31, 33, 35 can be made almost equal. For this reason, the energies in the quantum wells that store energy resonate with each other, increasing the resonant tunneling. This allows for extraction without waste of power generated near the incident light side. Also, by having multiple GaAs layers 32, 34, and making the film thickness of the second GaAs layer 34, which is on the incident light side, thicker than that of the first GaAs layer 32, which is on the substrate 3 side, not only visible light but also far-infrared light near the substrate 3 can be captured in the GaAs layers 32, 34, securing further power.

The front surface-side light absorption layer 10 has an InGaP layer 13 sandwiched between a first AlInP layer 12 and a second AlInP layer 14, and an Al content ratio in the first AlInP layer 12 stacked on the reflection layer 20 side is greater than that in the second AlInP layer 14 stacked on the surface electrode 1 side.

The front surface-side light absorption layer 10 sandwiches the InGaP layer 13 between the first AlInP layer 12 and the second AlInP layer 14 with high band gaps (2.10), forming a heterojunction. By making an Al content ratio in the second AlInP layer 14 40 or more, the light energy is made to stay in the GaAs layers 32, 34, and at the same time, the first AlInP layer 12 and the second AlInP layer 14 are designed not to absorb light. By making the Al content ratio in the first AlInP layer 12 45, which is more than the Al content ratio in the second AlInP layer 14, light energy is more easily stored in the InGaP layer 13. The InGaP layer 13 has an energy of 1.86 eV (electron volts) in a mono-junction, and the energy from the InGaP layer 13 sandwiched between the first AlInP layer 12 and the second AlInP layer 14 is considered to be 4.00 eV or more since it has two quantum wells.

Also, an InGaP layer 11 is formed between the front surface-side reflection layer 20u and the first AlInP layer 12. That is, this InGaP layer 11 is sandwiched between the front surface-side reflection layer 20u and the first AlInP layer 12.

By configuring the front surface-side light absorption layer 10 in this way, an absorption of ultraviolet light up to around 250 nm becomes possible, and power generation up to 230 nm was confirmed.

The laminated film 2 is composed of compounds such that the layers have almost the same crystal constants, and does not have a buffer layer for aligning the crystal constants.

When a compound solar battery according to this embodiment was used with a module with a size of 5 mm×5 mm and a thickness of 1.6 mm, a power generation was confirmed from 230 nm to 930 nm, and a power generation of 1.6v to 2.4v was obtained. Also, a stable wavelength could be confirmed in the temperature range from 20° C. to 80° C.

INDUSTRIAL APPLICABILITY

The compound solar battery of the present invention can generate electricity using not only sunlight but also indoor lighting.

DESCRIPTION OF SYMBOLS

1 Surface electrode
2 Laminated film

3 Substrate
4 Back electrode
5a Protective film
5b Protective film
6 TiOx layer
7 GaAs layer
10 Front surface-side light absorption layer
11 InGaP layer
12 First AlInP layer
13 InGaP layer
14 Second AlInP layer
20 Reflection layer
20d Back surface-side reflection layer
20u Front surface-side reflection layer
30 Back surface-side light absorption layer
31 First InGaP layer
32 First GaAs layer
33 Second InGaP layer
34 Second GaAs layer
35 Third InGaP layer

The invention claimed is:

1. A compound solar battery in which
a surface electrode, a laminated film, a substrate, and a back electrode are stacked in order, wherein there is a part of a surface of the laminated film not contacted by the surface electrode, wherein:
the laminated film comprises:
   a reflection layer formed of an AlGaAs layer, wherein the reflection layer comprises a front surface-side reflection layer and a back surface-side reflection layer;
   a front surface-side light absorption layer formed between the surface electrode and the reflection layer; and
   a back surface-side light absorption layer formed between the reflection layer and the substrate; and wherein
an Al content ratio in the front surface-side reflection layer is greater than that in the back surface-side reflection layer, and
the back surface-side light absorption layer comprises:
a first InGaP layer, a first GaAs layer, a second InGaP layer, a second GaAs layer, and a third InGaP layer formed by laminating from a side of the substrate, and wherein:
a film thickness of the second GaAs layer is larger than that of the first GaAs layer.

2. The compound solar battery according to claim 1, wherein
   the front surface-side light absorption layer comprises an InGaP layer sandwiched between a first AlInP layer and a second AlInP layer, and
an Al content ratio in the first AlInP layer stacked on a side of the reflection layer is greater than that in the second AlInP layer stacked on the surface electrode side.

3. The compound solar battery according to claim 2, wherein
an InGaP layer is sandwiched between the front surface-side reflection layer and the first AlInP layer.

* * * * *